United States Patent

[11] 3,585,461

[72] Inventors Robert T. Eynon
Glen Burnie;
Richard Criswell Grace, Woodlawn, both of, Md.
[21] Appl. No. 706,290
[22] Filed Feb. 19, 1968
[45] Patented June 15, 1971
[73] Assignee Westinghouse Electric Corporation
Pittsburgh, Pa.

[54] HIGH RELIABILITY SEMICONDUCTIVE DEVICES AND INTEGRATED CIRCUITS
1 Claim, 3 Drawing Figs.

[52] U.S. Cl. .......... 317/234,
317/235, 29/588, 29/589, 29/591
[51] Int. Cl. .......... H01l 1/14
[50] Field of Search .......... 317/234,
235; 29/588, 589, 590, 591

[56] References Cited

UNITED STATES PATENTS

| | | | |
|---|---|---|---|
| 3,383,568 | 5/1968 | Cunningham | 317/235 |
| 3,409,809 | 11/1968 | Diehl | 317/234 |
| 3,419,765 | 12/1968 | Clark et al. | 317/234 |
| 3,429,029 | 2/1969 | Langdon et al. | 29/589 |
| 3,436,616 | 4/1969 | Jarrad | 317/234 |
| 3,442,012 | 5/1969 | Murray | 29/590 |
| 3,465,209 | 9/1969 | Denning et al. | 317/234 |

OTHER REFERENCES

SCP & Solid State Technology, Page 54, January 1967.

*Primary Examiner*—John W. Huckert
*Assistant Examiner*—R. F. Polissack
*Attorneys*—F. Shapoe, C. L. Menzemer and G. H. Telfer

ABSTRACT: A metallization process and structure for semiconductive devices and integrated circuits with a high degree of protection against impurities affecting device characteristics is provided having a first insulating layer, such as one of thermally grown silicon dioxide, formed on the device with openings where contacts are desired, a first metal layer forming contacts and interconnections between selected contacts of a metal such as aluminum, a second dielectric layer such as a glass layer with openings only over those portions of the previous metal layer in bonding pad areas, a second metal layer of a material, such as titanium, very tightly adherent to the glass dielectric deposited within and around the opening of the second insulating layer covered by a third metal layer preferably of gold with a gold lead wire bonded thereto or other means for external connection.

PATENTED JUN 15 1971 3,585,461

WITNESSES:
Bernard R. Gieguay
James F. Young

INVENTORS
Richard C. Grace and
Robert T. Eynon.
BY Gordon H. Telfer
ATTORNEY

HIGH RELIABILITY SEMICONDUCTIVE DEVICES AND INTEGRATED CIRCUITS

BACKGROUND OF THE INVENTION

1. Field of the Invention

This invention relates to the provision of contacts and metallic interconnections on semiconductive devices, particularly semiconductor integrated circuits.

2. Description of the Prior Art

Conventional integrated circuits generally employ aluminum contacts and interconnections that pass over the surface passivation layer of silicon dioxide with gold wire bonding at bonding pads in the interconnection pattern. Such devices are mounted and encapsulated in a variety of ways but are susceptible to failure primarily due to four causes: foreign material occurring at the semiconductive device surface itself, reaction between metals such as aluminum-gold intermetallics occurring at elevated temperatures to produce weak or insulating bonds, corrosion of exposed materials due to nonhermetic sealing, and mechanical defects occurring during die handling operations that cause open aluminum interconnects and poor yield. A variety of techniques have been employed to try to avoid these problems or minimize their effects involving deposition of various protective layers, utilization of various metal combinations as well as others that in some degree have improved the situation but have not been outstandingly successful in all respects.

SUMMARY OF THE INVENTION

The primary purposes of this invention are to provide a contact and metallization scheme for semiconductive devices, particularly integrated circuits, with optimum mechanical, electrical, and chemical properties with relative ease of fabrication. The semiconductor body is to be completely protected against foreign material. Metallization employed is to be nonreactive and form strong bonds with adjacent material. Susceptibility to changes in device characteristics due to radiation bombardment is to be avoided. All metallic materials that are susceptible to corrosion are to be protected. Preferably the foregoing purposes are achieved while retaining the advantage of the present fabrication procedures including the aluminum contacting and gold wire bonding capability.

The present invention achieves the foregoing as well as additional objects and advantages and provides a structure that includes a body of semiconductive material having a plurality of semiconductive regions at the surface thereof with a first insulating layer on the surface. A plurality of ohmic contacts are positioned within openings in the first insulating layer and a pattern of interconnections are disposed on the insulating layer selectively interconnecting the ohmic contacts. A second insulating layer over the first insulating layer and over the pattern of interconnections is provided with openings only over bonding pad portions of the first metal layer. A second metal layer disposed on the bonding pad portions provides a seal at its periphery to the second dielectric layer while an additional metal layer provides maximum ease of wire bonding or other electrode attachment techniques. In this combination it is preferred for ease of fabrication that the first metal layer be of aluminum, the second metal be of a metal of groups IVB, VB, and VIB of the periodic table, such as titanium, and that the third metal layer be of a noble metal such as gold.

DESCRIPTION OF THE PREFERRED EMBODIMENTS

Figure 1:
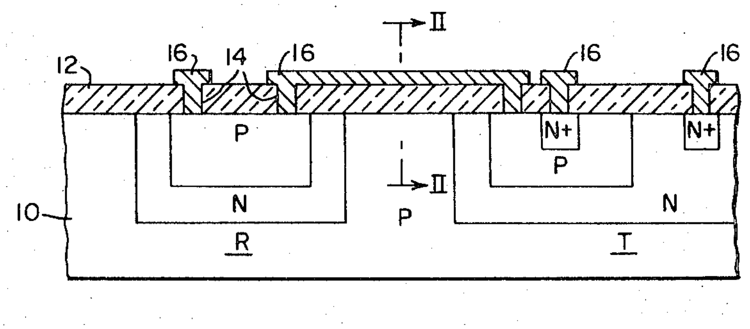
FIG. 1 is a partial sectional view of a semiconductor integrated circuit that may embody the present invention at a stage of fabrication before application of the improved features of the present invention.

Referring to FIG. 1 a semiconductor integrated circuit is shown including a unitary body 10 of semiconductive material having a plurality of P- and N-type regions therein. The exact nature of the integrated circuit is immaterial as far as the present invention is concerned. The structure shown is merely representative and includes in the left-hand portion a resistor R and in the right-hand portion a transistor T. The manner in which such structures may be fabricated may be found elsewhere. On the surface of the device, as is also conventional, occurs a first insulating layer 12 that has openings 14 where contacts are desired to the various semiconductive regions. As shown in FIG. 1 a first metal layer 16 is disposed on the surface and extends within the openings 14 to provide the ohmic contacts and also extends over the insulating layer 12 to provide interconnections between selected contacts. The first insulating layer 12 and first metal layer 16 may be and preferably are thermally grown silicon dioxide (possibly also including a layer of silicon nitride) and aluminum, respectively, as is presently practiced in the art, although other passivation layers and contact metals may be used.

Figure 2:
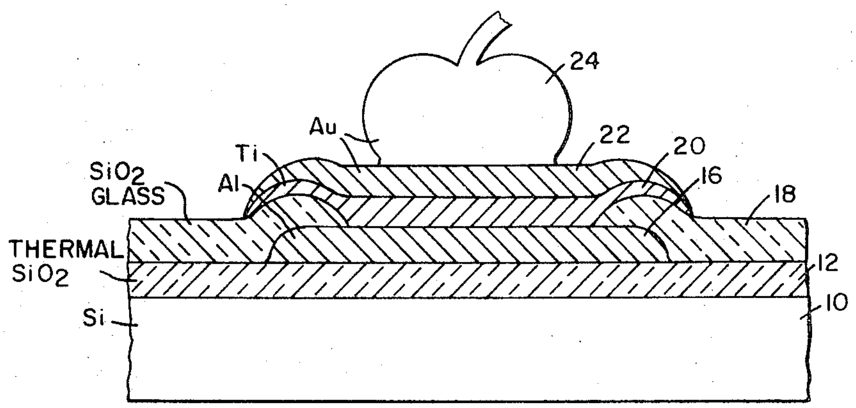
FIGS. 2 and 3 are alternate enlarged partial views corresponding to that of the structure of FIG. 1 taken along the line II–II illustrating examples of the present invention.

FIG. 2 shows the structure including the improvement of this invention. It shows only one of the many bonding pad structures that may be simultaneously formed in accordance with this invention. A second insulating layer 18 is disposed over the first insulating layer 12 as well as over the contact and interconnection pattern of layer 16 except where bonding pads are located. Such areas are where external conductive connection is to be made. In those portions of the device the second insulating layer 18 covers the periphery of the aluminum 16 and defines a window in which there are disposed two additional metal layers including a second layer 20 of a metal of Group IVB VB, or VIB of the periodic table such as titanium, tantalum, and molybdenum with an additional layer 22 of noble metal such as gold thereon to which a gold leadwire 24 may be bonded by thermal compression bonding or other techniques employed of which some will be subsequently described. Titanium is preferred for the layer 20.

The second dielectric layer 18 may be formed by depositing a silicon dioxide glass such as by a low temperature silane decomposition although other glass depositions may be employed including RF sputtered quartz or vapor deposited silicon oxide, quartz or Pyrex glass. Both insulating layers 12 and 18, therefore, preferably include a major portion of silicon oxide. In all instances in which the invention requires pattern delineation conventional photolithographic techniques may be employed with suitable selection of etchants for the particular materials.

Vacuum evaporation of the metal layers may be conveniently employed. The titanium and gold layers may be successively deposited within a single vacuum system pump down.

It is preferred to employ a slow shuttered evaporation of the initial aluminum layer to get a better quality layer. The evaporated aluminum from the source, such as on a tungsten coil, is prevented by a shutter from being deposited on the substrate except during an intermediate portion of the evaporization cycle. That is, the initially evaporated aluminum and the last evaporated aluminum from the source are not permitted to bombard the device because it is found that the initial portion may contain impurities occurring in the original aluminum and the terminal portion may contain impurities from the heater employed for the evaporation.

Layer thicknesses are not highly critical for the metal layers. Generally a thickness of the order of 8,000 to 10,000 angstroms for each layer is suitable. A similar magnitude is suitable for the dielectric layers. It is important however that the titanium and gold layers 20 and 22 extend over the edge of the opening in the second dielectric layer 18 to insure complete sealing of the underlying aluminum which is susceptible to corrosion by moisture. This may be for example by overlapping layers 20 and 22 about one-half mil all around the window opening. Titanium, and others of the group referred to, is a reactive refractory metal which reacts with the oxide or a glass layer 18 to form the seal and provides good corrosion resistance as well as prevents penetration of foreign ions to the device surface. Additionally this structure preserves the ability to make good ohmic contacts by reason of the use of aluminum as well as good lead attachments by use of gold on the surface.

By way of further example, integrated circuits have been made by the following procedure in accordance with this invention: Diffused silicon wafers having thermally grown silicon dioxide (insulating layer 12) and aluminum contacts and interconnects (metal layer 16) formed by conventional techniques (except for a slow shuttered aluminum evaporation as was previously described) were cleaned by etching aluminum oxide occurring on the aluminum with, e.g., 20 g. chromium trioxide and 35 ml. conc. phosphoric acid diluted to one liter on which the wafers were placed for about 1 minute at room temperature. The wafers were then rinsed in de-ionized water and thoroughly dried.

The glass deposition (insulating layer 18) was performed by decomposition of silane in oxygen using nitrogen to purge the open tube chamber in which it was carried out. Typical conditions were 1500 cc./min. nitrogen, 95 cc/min. oxygen, and 173 cc./min. silane. The wafers were on a plate heated to 455° C. and deposition was continued for about 18 minutes to form a silicon oxide glass layer 8000 angstroms thick after which the silane was cut off and the wafers baked in the nitrogen-oxygen atmosphere for about 15 minutes.

The glassed wafers were cleaned, dried, and applied with a photoresist (e.g., Kodak Metal Etch Resist), the photoresist was exposed and developed by known techniques. A buffered etch was applied to form the windows in the bonding pad areas, e.g., a solution including 1 part concentrated hydrofluoric acid and 6 parts ammonium fluoride for about 1 minute. The photoresist was removed.

Prior to titanium and gold deposition, the wafers were treated to make sure the exposed aluminum was thoroughly cleaned by a one minute dip in the above mentioned aluminum oxide etch, a rinse in de-ionized water and thorough drying. The wafers were placed in a vacuum chamber evacuated to $2 \times 10^{16}$ torr, and titanium and gold were successively evaporated to form layers each about 10,000 angstroms thick.

A photoresist masking procedure was performed on the gold surface with Kodak Metal Etch Resist to cover the metal in the bonding pad areas and a peripheral portion of the metal over the edge of the glass windows. The masked wafers were subjected to a preheated (85° C.) commercially available gold etch (AURO-STRIP, 1 lb./gal.) for about 20 seconds. They were then subjected to a preheated (110° C.) titanium etch (50 percent sulfuric acid solution) for about 5 seconds. The photoresist was stripped and usual wafer testing, scribing, breaking, and gold wire bonding operations were performed.

Devices in accordance with this invention have been made and have withstood at least 30 hours of steam and water at elevated pressure with no indication of corrosion of the aluminum.

Figure 3:
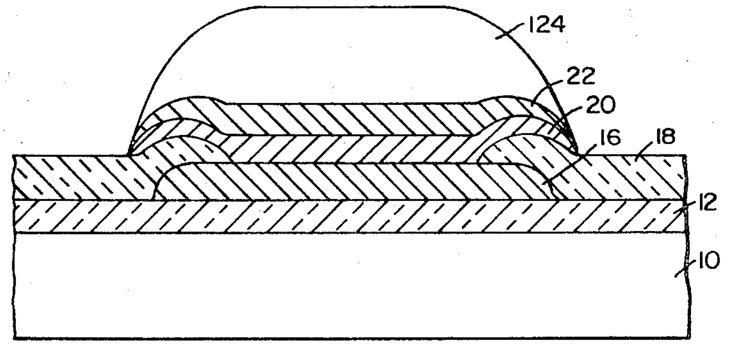

In addition to the utilization of gold wire bonding it is possible to employ structures in accordance with this invention utilizing the "solder bump" concept. Instead of lead wires joined to the bonding pad areas enlarged conductive bumps are applied such as by plating additional gold on the disclosed structures through a photoresist mask. The structure may then be bonded by inverting it on a support that includes conductive pathways in printed circuit fashion. Additionally solder may be applied by vertically dipping a preheated substrate (about 150° C.) into molten tin-lead solder which will adhere only to the exposed gold layer. FIG. 3 illustrates a structure like that of FIG. 2 except that element 124 is a mass of conductive metal, about 5 mils in diameter, for example. The mass of metal 124 may be a quantity of plated gold on the evaporated gold layer 22 or tin-lead solder as described or other conductive material of sufficient size to be suitable for face down bonding techniques.

There have been proposals for other integrated circuit metallization schemes that utilize gold to gold bonding. Such schemes use gold in the interconnects themselves with the result that exposure to a radiation environment causes degradation in device performance. Gold inherently absorbs charge when bombarded and the charge causes inversion (induced change of conductivity type) under the oxide layer. Here, that effect cannot occur since the gold is confined to bonding pad areas which are normally not over active PN junctions.

While the invention has been shown and described in a few forms only it will be apparent that various changes and modifications may be made without departing from the spirit and scope thereof.

We claim:

1. A semiconductor device structure comprising; a body of semiconductive material including a plurality of semiconductive regions at a surface thereof; a first insulating layer on said surface; said first insulating layer consisting of a layer of silicon dioxide and a layer of silicon nitride a plurality of ohmic contacts positioned within openings in said first insulating layer; a pattern of conductive interconnections on said first insulating layer and selectively interconnecting said ohmic contacts; said ohmic contacts and interconnections consisting essentially of aluminum; a second insulating layer over said first insulating layer where exposed and over said contacts and interconnections with openings over portions of said interconnections; a first metal layer over each of said portions of said interconnections within said openings and adhering at its periphery to said second insulating layer; said first metal layer consists essentially of titanium a second metal layer covering said first metal layer said second metal layer consisting essentially of gold.